United States Patent
Tyneski et al.

[11] Patent Number: 5,493,478
[45] Date of Patent: Feb. 20, 1996

[54] CAM ACTUATED CONTROL DEVICE INCLUDING A PLURALITY OF BINARY SWITCHES COPLANARLY MOUNTED ON A CIRCUIT SUBSTRATE

[75] Inventors: Frank M. Tyneski, Plantation; David E. Reiff, Ft. Lauderdale; Gregory D. Jackson, Plantation; Frank Garcia, Miami; Danny E. Ross, Plantation, all of Fla.

[73] Assignee: Motorola, Inc., Schaumburg, Ill.

[21] Appl. No.: 191,677

[22] Filed: Feb. 4, 1994

[51] Int. Cl.$^6$ .............................. H05K 7/02; H01H 3/42
[52] U.S. Cl. .................. 361/781; 200/568; 200/8 R; 200/573; 361/814
[58] Field of Search ................... 200/5 R, 11 R, 200/8 R, 252, 564, 568, 574, 573, 565; 361/781, 814, 728, 733; 455/347

[56] References Cited

U.S. PATENT DOCUMENTS

| | | | |
|---|---|---|---|
| 2,935,591 | 5/1960 | Lee | 200/568 |
| 4,071,720 | 1/1978 | Krajci et al. | 200/6 B |
| 4,567,339 | 1/1986 | Monie | 200/153 |
| 4,727,225 | 2/1988 | Jones | 200/568 |
| 5,063,364 | 11/1991 | Tsoi | 200/568 |
| 5,315,077 | 5/1994 | Simon et al. | 200/11 R |

FOREIGN PATENT DOCUMENTS

| | | | |
|---|---|---|---|
| 473228 | 6/1975 | U.S.S.R. | 200/574 |

*Primary Examiner*—Donald A. Sparks
*Attorney, Agent, or Firm*—Andrew S. Fuller

[57] ABSTRACT

A cam actuated control device (10) is provided. The control device (10) includes at least two momentary switches (13, 14) which are surface mounted on a circuit substrate (12). An actuating member (20) having a contoured cam surface (25) is movably positioned proximate to the switches (13, 14) such that movement of the actuating member (20) selectively actuates the switches (13, 14) to produce a binary encoded output.

4 Claims, 3 Drawing Sheets

5,493,478

CAM ACTUATED CONTROL DEVICE INCLUDING A PLURALITY OF BINARY SWITCHES COPLANARLY MOUNTED ON A CIRCUIT SUBSTRATE

TECHNICAL FIELD

This invention relates in general to control devices, and more particular, to cam actuated control devices used in electronic products.

BACKGROUND

There has been a strong demand for low cost electronic products, such as portable two-way communication radios, and the like. A two-way radio commonly incorporates control devices to provide volume control, radio channel selection, and power on/off control, among other functions. Preferably, such control devices are ergonomically designed for easy operation, yet designed for manufacturability to reduce product costs.

Potentiometers and switches are commonly used in the construction of control devices. In a typical application, an operator utilizes a rotary knob, or other actuator, to engage a switching device, such as a potentiometer, to actuate a specific control function. For power on/off, or other similar control functions, simple two position switches are adequate. In other applications, such as volume control, the switching device must be capable of a variable output. Multiple position switches may be used to increase the number of discrete outputs, and thus provide a variable output. Mechanical potentiometers offer variable output but tend to have a high component cost and have poor durability.

Accordingly, there are various prior art implementations for providing a variable output control device. However, many prior art implementations are complex, have poor reliability, or are not designed for low cost manufacturing. The control device, including the combination of actuator and switching device, represents an area of opportunity for cost reduction in the design of two-way radios, and other electronic products. Therefore, there exists a need for a simple, cost effective, and easily manufactured control device for an electronic product.

DETAILED DESCRIPTION OF THE PREFERRED EMBODIMENT

Generally, the present invention provides for a cam actuated control device for an electronic product. The control device has an actuating member having a cam surface which interfaces with momentary switches, such as tactile switches. The cam surface is movably positioned proximate to the switches such that movement of the actuating member causes selective actuation of the switches. The selective actuation of the switches is coordinated to produce a binary encoded output corresponding to the movement of the actuating member. Accordingly, the control device is capable of multiple discrete outputs.

Figure 1:
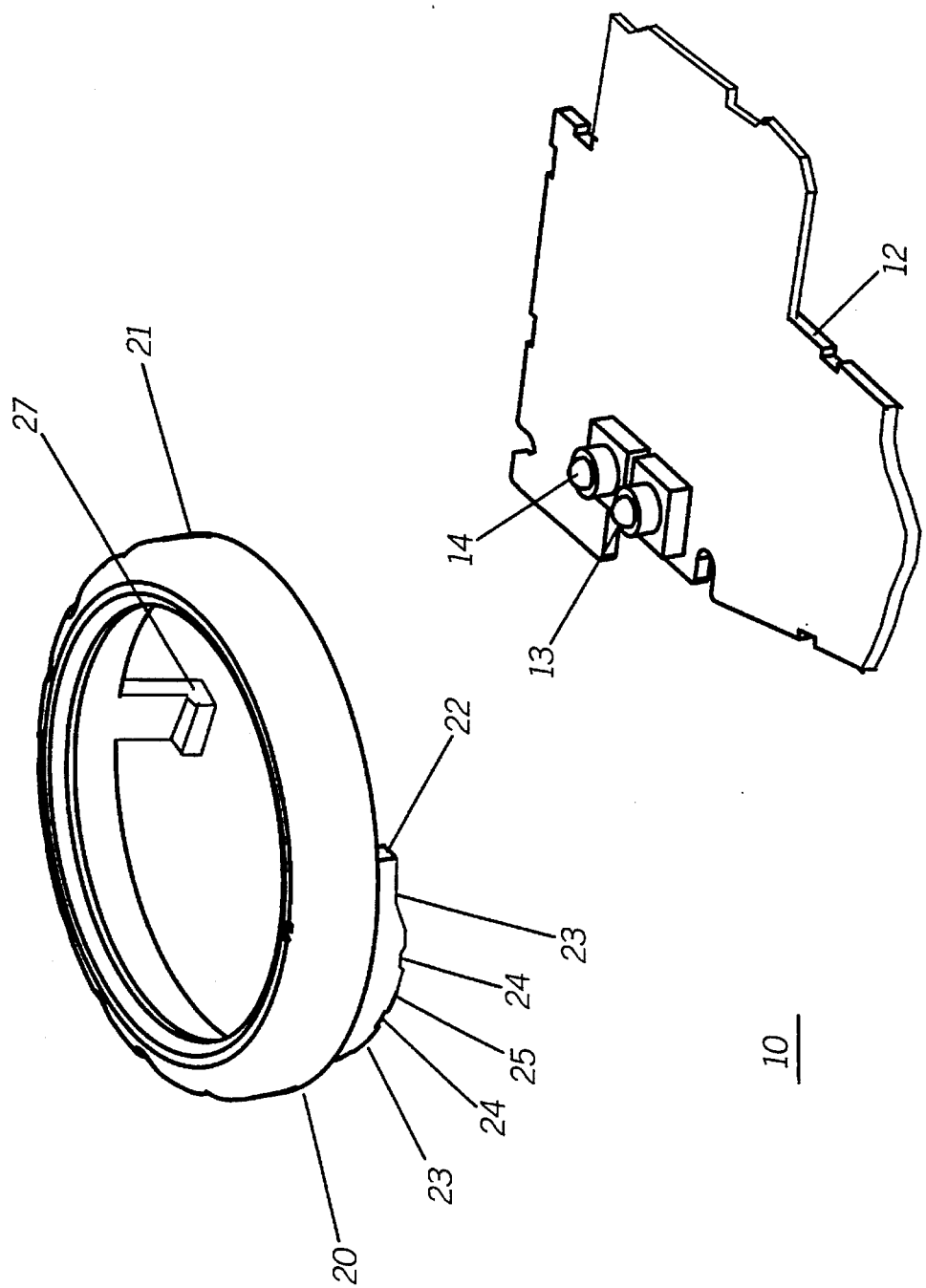
FIG. 1 is an exploded fragmentary view of a cam actuated control device together with a support substrate, in accordance with the present invention.
Figure 2:
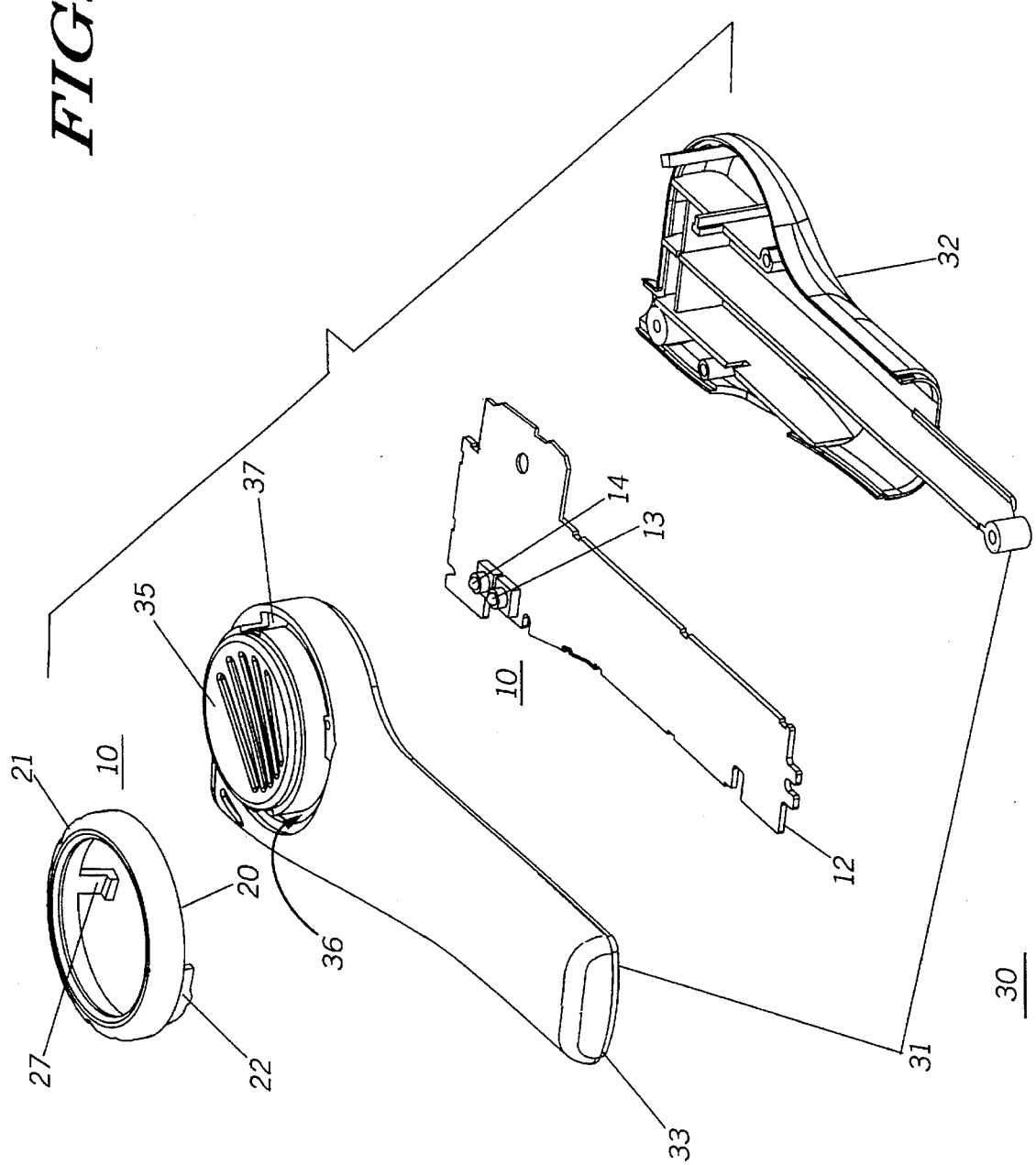
FIG. 2 is an exploded view of a radio incorporating the control device, in accordance with the present invention.

The present invention can be better understood with references to FIGS. 1 and 2. FIG. 1 is an exploded fragmentary view of a cam actuated control device 10 together with a support substrate 12, in accordance with the present invention. The control device assembly 10 includes momentary switches 13, 14 and a corresponding actuating member 20. In the preferred embodiment, there are two momentary contact switches 13, 14, which are two-position discrete tactile switches 13, 14 commonly available from electrical components suppliers. The momentary switches 13, 14 can be normally open or normally closed, but in the preferred embodiment, the momentary switches 13, 14 are normally open. Each switch is actuated when a depressing force is applied by the actuating member 20. As the switches 13, 14 are momentary switches 13, 14, they are actuated only during the application of the depressing force. When actuated, the switches 13, 14 complete electrically conductive paths (not shown), thereby generating a control signal to be decoded. Multiple two-position switches 13, 14 are used to produce a binary encoded output, which can be decoded by a controller or other decoding circuitry. In the preferred embodiment, the switches 13, 14 are individually mounted on a circuit substrate 12, such as by surface mounting, and are adjacently positioned. The switches 13, 14 are also electrically coupled to the circuit substrate 12.

The actuating member 20 is formed from a plastic material or other suitable material. The actuating member 20 comprises a grasping portion 21, and a switch actuating portion 22 extending from the grasping portion 21. Additionally, the actuating member 20 has a mount retainer 27 for mounting purposes. In the preferred embodiment, the grasping portion 21 is a circular rotary bezel 21. A combination of adjacently positioned lobes 24 and depressions 23 are formed on the switch actuating portion 22 to produce a contoured cam surface 25. The lobes 24 are portions formed to engage or actuate the switches 13, 14, while the depressions 23 are portions formed to accommodate the switches 13, 14, such that a switch is not actuated when a depression is positioned over that switch. This arrangement allows for selective actuation of the switches 13, 14. When the control device 10 is fully assembled, the bezel 21 is mounted such that the cam surface 25 of the switch actuating portion 22 is movably positioned proximate to the switches 13, 14. Preferably, the lobes 24 and depressions 23 are proximately positioned to the switches 13, 14, and are organized to selectively actuate the switches 13, 14 in response to the movement of the actuating member 20. In other words, the bezel 21 can be moved such that the cam surface 25 slides over the switches 13, 14, thereby operating directly on the switches 13, 14, such that the switches 13, 14 are selectively actuated, such as by depressing the switches 13, 14.

In the preferred embodiment, the control device 10 is a radio 30 volume control and power on/off switch assembly. The contour of the cam surface 25 is designed to cause the control device 10 to cycle through four binary encoded outputs generated by switch A 13, and switch B 14. The outputs correspond to the states of the switches 13, 14 as the switches 13, 14 are actuated by the cam surface 25 when the cam surface 25 moves across the switches 13, 14. The interaction between the cam surface 25 and switches 13, 14 produces the results depicted in Table 1. The number of switches 13, 14, the number of states each switch has, and the relative positioning of the switches, may all vary while still employing the concepts embodied by the present invention. Similarly, various embodiments of the actuating member 20 or cam surface 25 are possible which employ the concepts of the present invention.

TABLE 1

| Switch A | Switch B | Radio State |
| --- | --- | --- |
| Off | Off | Off |
| Off | On | Low volume |
| On | On | Medium volume |
| On | Off | High volume |

Referring to FIG. 2, an exploded view of a radio 30 incorporating the control device 10 is shown, in accordance with the present invention. The radio 30 comprises a radio housing 31 having first and second portions 33, 32, a circuit substrate 12, and the control device 10 including the actuating member 20 and momentary switches 13, 14. A speaker grill 35 portion is formed on the first portion 33 of the radio housing 31. A slot 36 proximate to the periphery of the speaker grill 35 is formed to accept the switch actuating portion 22 of the actuating member 20. The actuating member 20 is mounted to the first portion 33 of the radio housing 31 such that the switch actuating portion 22 is positioned in the slot 36, and such that the grasping portion 21 of the bezel 21 is positioned about the speaker grill 35. The actuating member 20 is secured by the retainer 27 which engages an mounting slot 37 within the first housing portion 33. Preferably, the grasping portion 21 is selectively marked with control indicators, such as volume indicators, to aid an operator in the operation of the radio 30. The slot 36 is sufficiently large to allow limited movement of the switch actuating portion 22 within the slot 36 when the bezel 21 is rotated.

The circuit substrate 12 is mounted with the second housing portion 32 of the radio housing 31. The circuit substrate 12 houses communication circuitry for communicating over radio frequency channels. The momentary switches 13, 14 are coplanarly mounted on the circuit substrate 12, and are aligned with the slot 36 on the first housing portion. Additionally, the switches 13, 14 are positioned such that rotation of the bezel 21 causes the movement of the cam surface 25 of the switch actuating member 20, which selectively actuates the switches 13, 14.

Figure 3:
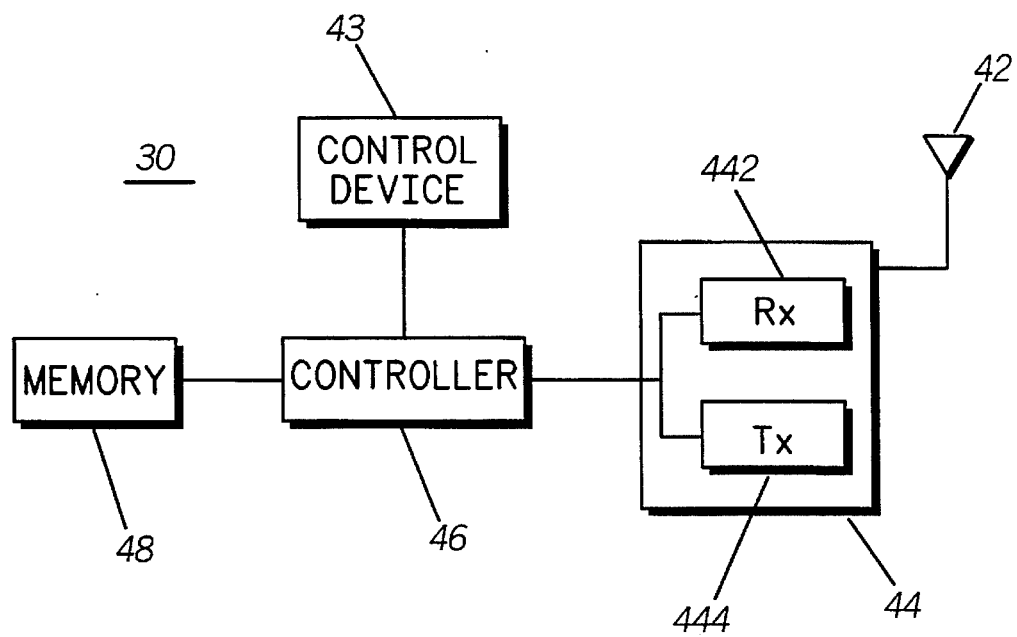
FIG. 3 is an electrical block diagram of the radio of FIG. 2.

Referring to FIG. 3, an electrical block diagram of the radio 30 is shown, in accordance with the present invention. The radio 30 is an electronic communication device used for two-way communication, and is capable of receive and transmit operation using well known principles. A controller 46, such as a microprocessor, uses logic and other information from an electrically coupled memory portion 48 to control the overall operation of the radio 30. The controller 46 is electrically coupled to a radio frequency (RF) portion 44 which includes a receiver 442 and a transmitter 444. The RF portion 44 is electrically coupled to an antenna 42. For receive operations, communication signals are received by the antenna 42 and are selectively processed by the receiver 442. Similarly, for transmit operations, communication signals are processed by the transceiver 444 and radiated through the antenna 42. The transmitter 444 and receiver 442 operate under the control of the controller 46. Additionally, binary encoded signals from the control device 10, represented by the control device 10 portion, are decoded by the controller to control power on/off and volume control functions.

According to the present invention, a cam actuated control device 10 is provided, which provides for multiple discrete outputs. The present invention offers several advantages. The control device 10 is easily incorporated into an electronic product which requires multiple control signals. The number of control device 10 outputs can be changed by changing the number of switches, by making appropriate changes to the cam surface 25, or by changing both. In the preferred embodiment, the control device 10 comprises momentary tactile switches 13, 14 mounted on a circuit substrate 12. The mounting of the switches 13, 14 is easily accomplished using an automated part placement machine. The tactile switches 13, 14 are readily available low cost components. Similarly, the actuating member 20 can be formed inexpensively, such as by injection molding. Thus, a simple, inexpensive control device 10 is provide which is designed to be easily manufactured.

What is claimed is:

1. A cam actuated control device, comprising:

a plurality of discrete momentary tactile switches coplanarly mounted on a circuit substrate, each switch having at least two positions, wherein two switches combine to have at least four states corresponding to the relative position of the two switches; and an actuating member having a contoured cam surface, the cam surface having depressions that acccommodate without actuating the switches, and lobes that actuate the switches when positioned over the switches, the cam surface movably positioned proximate to the two switches;

wherein movement of the actuating member moves the lobes and depressions of the cam surface over the two switches to selectively actuate the two switches succesively through each of the at least four states to produce a binary encoded output.

2. A cam actuated control device as defined in claim 1, wherein the lobes and depressions are contoured to correspond with each of the at least four states.

3. A radio having a cam actuated control device, comprising:

a radio housing;

a circuit substrate mounted within the radio housing;

a plurality of discrete momentary tactile switches coplanarly mounted on the circuit substrate, each switch having at least two positions, wherein two switches combine to have at least four states corresponding to the relative position of the two switches; and an actuating member comprising a rotary bezel having a contoured cam surface, the cam surface having depressions that acccommodate without actuating the switches, and lobes that actuate the switches when positioned over the switches, the cam surface movably positioned proximate to the two switches;

wherein movement of the actuating member moves the lobes and depressions of the cam surface over the two switches to selectively actuate the two switches succesively through each of the at least four states to produce a binary encoded output.

4. A cam actuated control device as defined in claim 3, wherein:

the radio housing has a speaker grill portion; and the rotary bezel is mounted about the speaker grill portion.

\* \* \* \* \*